United States Patent [19]
Ushida et al.

[11] Patent Number: 5,636,000
[45] Date of Patent: Jun. 3, 1997

[54] PROJECTION OPTICAL SYSTEM AND PROJECTION EXPOSURE APPARATUS USING THE SAME

[75] Inventors: Kazuo Ushida; Sumio Hashimoto, both of Setagaya-ku, Japan

[73] Assignee: Nikon Corporation, Japan

[21] Appl. No.: 495,726

[22] Filed: Jun. 27, 1995

[30] Foreign Application Priority Data

Jun. 30, 1994 [JP] Japan .................................. 6-170377

[51] Int. Cl.⁶ .................................................. H01L 21/027
[52] U.S. Cl. ................................. 355/30; 355/53; 355/55
[58] Field of Search ................................ 355/30, 53, 55

[56] References Cited

U.S. PATENT DOCUMENTS

| | | | |
|---|---|---|---|
| 5,025,284 | 6/1991 | Komoriya et al. | 355/53 |
| 5,137,349 | 8/1992 | Tanigucho et al. | 355/122 |
| 5,170,207 | 12/1992 | Tezuka et al. | |
| 5,270,771 | 12/1993 | Sato | 355/53 |

FOREIGN PATENT DOCUMENTS 2-200838  3/1992  Japan .

OTHER PUBLICATIONS

Miyaji et al., "Excimer lithography for ULSI", Optical and Quantum Electronics 25 (1993), pp. 297–310.

Nishida, "Achromatic Lens by Combining Diffraction Grating and Refractive Lenses", Shashin Kogyo, Mar. 1994.

Primary Examiner—Arthur T. Grimley
Assistant Examiner—David A. Lane
Attorney, Agent, or Firm—Pennie & Edmonds

[57] ABSTRACT

A projection exposure apparatus can correct focal point movement caused by an environmental change, such as a change in temperature or atmospheric pressure, during an operation, while minimizing occurrence of a new aberration such as a spherical aberration caused by focus correction. The projection exposure apparatus of this invention exposes a mask pattern on a photosensitive substrate via a projection optical system. The projection optical system includes a refraction or reflection type optical member, and a diffraction type correction optical member. The correction optical member has focal position movement with an environmental change during an operation in a direction opposite to the direction of focal position movement of the optical member with the environmental change during the operation.

12 Claims, 8 Drawing Sheets

$F_a$ : SYNTHETIC FOCAL LENGTH FROM RETICLE R TO POSITION IMMEDIATELY BEFORE DIFFRACTION OPTICAL ELEMENTS $F_b$ : SYNTHETIC FOCAL LENGTH OF DIFFRACTION OPTICAL ELEMENTS $F_c$ : SYNTHETIC FOCAL LENGTH FROM POSITION IMMEDIATELY AFTER DIFFRACTION OPTICAL ELEMENTS TO WAFER W $d_0 = 771.99137$ ( $= 623.17876 + 148.81861$ ) (UNIT: mm)

$d_1 = -148.81861$ $d_2 = 74.547$

PROJECTION OPTICAL SYSTEM AND PROJECTION EXPOSURE APPARATUS USING THE SAME

BACKGROUND OF THE INVENTION

1. Field of the Invention

The present invention relates to a projection exposure apparatus for exposing/transferring fine patterns on a substrate, which apparatus is used for the manufacture of, e.g., semiconductor elements such as LSIs.

2. Related Background Art

A lithographic process including transfer and exposure steps for a predetermined pattern is applied to the manufacturing process for semiconductor elements such as ICs and LSIs, similar members having fine patterns, such as liquid crystal elements and thin-film magnetic heads, and the like. In this process, exposure light from a mask having a predetermined circuit pattern and the like is projected on a photosensitive substrate such as a silicon wafer via a projection optical system to transfer the pattern formed on the mask onto the wafer.

As is apparent from the transition from the conventional ICs and LSIs to the current VLSIs and ULSIs, semiconductor integrated circuits have increased in integration degree. With this trend, projected patterns have been decreasing in size. Therefore, a higher resolution (resolving power) is required for projection optical systems and exposure apparatuses.

SUMMARY OF THE INVENTION

A projection exposure apparatus of the present invention exposes a mask pattern on a photosensitive substrate via a projection optical system by irradiating a light beam from a light source means onto the mask. The projection optical system includes a refraction or reflection type optical member, and a diffraction type correction optical member. The correction optical member exhibits focal position movement with an environmental change during an operation in a direction opposite to the direction of focal position movement of the optical member with the environmental change during the operation.

The correction optical member is preferably constituted by a plurality of diffraction optical elements.

The correction optical member preferably includes at least a diffraction optical element having a property of converging a light beam, and at least a diffraction optical element having a property of diverging a light beam.

The correction optical member preferably includes two diffraction optical elements constituted by members having different thermal expansion coefficients.

DETAILED DESCRIPTION OF THE PREFERRED EMBODIMENTS

Figure 1:
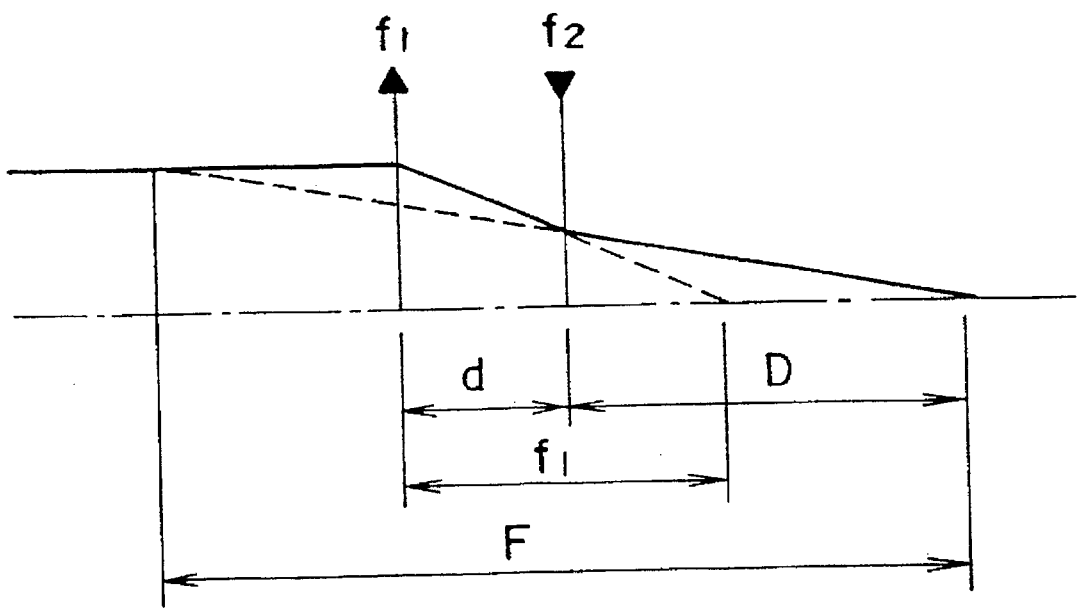
FIG. 1 is a view showing a state of focal point movement based on a correction optical member (diffraction optical elements) in a projection optical system of the present invention.

The numerical aperture (NA) of an optical system must be increased to increase the resolution of a projection exposure apparatus. However, with an increase in numerical aperture, the depth of focus of the optical system decreases. As a result, focal point movement greatly increases its influence on transfer/exposure (the state of a projection image on a wafer). For this reason, the focal position moves from a projection surface (wafer surface) even with slight variations in temperature and atmospheric pressure, so that the projection surface falls outside the range of the depth of focus. Consequently, exposure (transfer/exposure) cannot be performed with a required resolution.

In order to solve this problem, a focal position correction means has been proposed in a conventional projection exposure apparatus. For example, focus correction is performed with respect to variations in temperature and atmospheric pressure by changing the space between some lenses in a projection lens system (exposure apparatus), or dividing a projection lens system into several sealed blocks and controlling the pressure in each block.

If, however, some lenses are moved to correct the focal point, the arrangement of the lens system deviates from the arrangement based on optical design. Therefore, a new aberration such as a spherical aberration may be caused with respect to a projection image. As a result, such lens movement may cause a decrease in resolution.

Consider the means of changing the pressure in each block in the lens system. This pressure change may adversely affect a lens itself. If, for example, the pressure of a portion in contact with a lens surface is changed, the shape of the lens surface may change owing to variations in pressure. Such deformation of the lens also causes a new aberration such as a spherical aberration.

Japanese Patent Laid-Open No. 4-214516 discloses an apparatus which uses a Fresnel lens as a member for correcting an aberration based on the design of a projection optical system (projection lens system). In this case, a Fresnel lens having a well-known structure (having a spherical or aspherical lens surface with concentric grooves) is used, and only quartz is used as glass material for lenses constituting the projection optical system.

In this case, although a correction means for an aberration based on design is disclosed, no correction means for an environment change during an operation is disclosed. A change in focal position (imaging position) with this environmental change increases beyond a practical allowable degree.

A projection optical system of the present invention includes a refraction or reflection type optical member and a refraction type correction optical member. The moving directions of the focal points of these optical members change in opposite directions with the respective environmental changes during an operation to cancel out the focus moving amounts of the respective optical systems, thereby correcting a change in imaging position.

In this case, as the refraction type optical member, an optical member for deflecting an optical path with a refracting effect is used. A general transmission refracting lens, a prism, or the like corresponds to this optical member. Also, a plane-parallel plate is considered to be a member having refraction properties. The reflecting member is an optical member for deflecting an optical path with a reflecting effect. A reflecting mirror, a reflecting film, or the like corresponds to this optical member. The shape of a reflecting surface is not specifically limited. That is, the reflecting surface includes not only a flat surface but also a curved surface or the like.

The diffraction optical member is an optical member for deflecting an optical path with a refracting effect, which member includes a transmission type and a reflection type. This diffraction optical member is constituted by a so-called diffraction optical element. The element can arbitrarily deflect the optical path of a light beam having a short wavelength, which operation cannot be performed by a refraction lens. In addition, the diffraction optical element has wavelength-deflection characteristics different from those of a reflecting lens (i.e., having a reciprocal dispersion with respect to the reflecting lens). For this reason, attention has been paid to a new aberration correction means based on a combination of the diffraction optical member and the reflecting lens.

For example, a Fresnel zone plate or the like is known well as a diffraction optical element. A general Fresnel zone plate is designed such that concentric light-shielding members are arranged on a light-transmitting substrate. This zone plate is used to focus a light beam onto a predetermined position by using a refraction effect on the light beam from a light-transmitting area.

As the structure of a diffraction optical element including a zone plate, not only the above structure constituted by light-transmitting and light-shielding portions but also a structure in which areas having different transmission characteristics (e.g., refractive indexes and transmission distances) are arranged in a stepwise manner, or a structure in which portions having different transmission characteristics based on a refractive index distribution are arranged in a substrate are known. A typical example of the former is a so-called binary optics (BOE). A typical example of the latter is a so-called hologram optics (HOE).

According to a BOE, a stepped surface shape is formed on an optical light-transmitting member (or may be formed on the surface of a reflecting member) by using a lithographic process to form portions having different transmission distances, thereby producing a refracting effect. The BOE is advantageous in freely forming an arbitrary fine pattern with a high precision owing to its manufacturing method. In particular, therefore, a great deal of attention is paid to the application field of the BOE (Shashin Kogyo, March Issue, 1994, p. 94).

According to these sophisticated diffraction optical elements such as a BOE, refracted light exhibits not only a known-well converging effect with respect to one point, but also a refracting effect, e.g., converting an arbitrary wave surface into a desired wave surface, exhibiting a light diverging function, and allowing a combination of a light converging function and a beam splitting function.

In addition, the BOE is thin and lightweight, and facilitates mass production, easy manufacture with a high refracting effect, high light utilization, and deflection of even the optical path of a light beam in a deep ultraviolet region. Owing to these advantages, applications of the BOE as an optical member of a projection optical system have been studied.

The projection optical system of the present invention uses such a diffraction optical element as a means for correcting a variations in focal position with an environmental change during an operation. In general, a variation in the focal position of a projection optical system with an environmental change during an operation can be predicted. The projection optical system of the present invention has a diffraction optical element for causing a variation in focal position in an opposite direction to a variation in the focal position of the projection optical system before correction with an environmental change during an operation. Therefore, a variation in the focal position of the projection optical system after correction is canceled out.

If at least the direction of a variation in the focal position of this diffraction optical member with an environmental change such as a change in temperature or pressure is opposite to that of a projection optical system other than the diffraction optical member, the total amount of variation in the focal position of the projection optical system can be greatly suppressed. If the variation amount after synthesis of the above variation amounts falls within the range of the depth of focus of the overall projection optical system, a projection image can be transferred/exposed while the resolution of the projection optical system is maintained.

The overall projection optical system is preferably designed to set the synthetic variation amount to zero. With this design, no variation in focal position occurs with an environmental change during an operation. Even if, therefore, an optical system having a small depth of focus is used, no variation in imaging position occurs, and a projection image can always be formed on a photosensitive substrate as an exposure target with a high precision.

In addition, such a diffraction optical member (element) may be a member specially designed for focal position correction with respect to an environmental change, or a member for simultaneously performing focal position correction and aberration correction as described above. For example, in a projection optical system which poses problems of, e.g., a new aberration with an environmental change during an operation, a diffraction optical member for also performing this new aberration may be used as a correction optical member.

Assume that a correction optical member is constituted by a plurality of diffraction optical elements. In this case, focal position variations and other imaging characteristic variations of the respective elements with an environmental change during an operation are synthesized. With this operation, the overall imaging characteristic variations of the projection optical system with the environmental change during the operation can be corrected.

For example, this method is especially effective in preventing a new aberration caused by focus correction. That is, as described above, in performing focal position correction, the focal position is moved in an opposite direction to the projection optical system before correction. As a result, the imaging position is moved. For this, occurrence of an aberration upon this movement can be measured in advance. Therefore, a good correction means can be obtained by using, e.g., a diffraction optical element for correcting this aberration on the basis of this measurement.

A correction optical member preferably includes at least one diffraction optical element having a light converging property and one diffraction optical element having a light diverging property.

In this case, the element having the light converging property is an element, such as a Fresnel zone plate, which has a property of deflecting an optical path in a direction in which refracted light emerging from the element is converged. Consider a refracting lens as this element. In this case, this element can be considered to be equivalent to a lens having a so-called positive power. The element having the light diverging property is an element, such as a concave lens of refracting lenses, which exhibits a deflecting effect on an optical path, and has a property of deflecting an optical path in a direction in which refracted light emerging from the element is diverged.

These properties will be referred to as a positive or negative power hereinafter as in the case with a reflecting lens. In addition, the distance to the focusing position of a diffraction optical element having a property of converging light onto one point, or the distance to the divergence reference position of a diffraction optical element having a proper of diverging light from one point is called a focal length.

In the present invention, for example, a diffraction optical element (e.g., an annular phase grating or Fresnel zone plate) having a positive power which serves to focus a parallel light beam onto one point on the optical axis is arranged near the stop of a projection optical system, and a diffraction optical element (e.g., an annular phase grating) having a negative power which diverges a parallel light beam from one point on the optical axis is arranged near the above element.

Let $f_1$ ($f_1>0$) be the focal length of the diffraction optical element having the positive power, and $-f_2$ ($f_2>0$) be the focal length of the diffraction optical element having the negative power. In this case, when the synthetic focal length is set to be positive, i.e., the overall structure is to function as a grating (diffraction optical member) having a positive power, the respective focal lengths may be set according to $f_1 < f_2$. If occurrence of various aberrations such as a spherical aberration upon focus correction by these diffraction optical members is to be completely suppressed, $f_1 = f_2$ may be set.

These design conditions influence the overall imaging characteristics of the projection optical system. For this reason, when the deflecting effect of a diffraction optical member is to be used for imaging characteristics in designing a projection optical system, optical design may be performed to have a positive power as a whole or a negative power as a whole with $f_1 > f_2$. If the respective focal lengths satisfy $f_1 = f_2$, only focal length correction can be performed without any influence on imaging characteristics.

If a correction optical member includes two diffraction optical elements consisting of materials having different thermal expansion coefficients, the two diffraction optical elements have different deformed states with a change in temperature.

In this case, the focal point moving amount of the correction optical member with a change in temperature is adjusted. If the two diffraction optical elements consist of the same material, the two elements undergo changes at the same ratio with a change in temperature, exhibiting only a focal point moving amount corresponding to the deformation of the pattern of each diffraction optical element. If, however, the two diffraction optical elements consist of different materials, the two elements have different deformation amounts to set a new refracted/deflected state. Therefore, this structure is adaptable to large or small correction of a focal point moving amount.

When, for example, a focal position (or a imaging position) is to be corrected by adjusting the temperature of the correction optical member, the member is preferably constituted by a combination of diffraction optical elements consisting of glass materials having different thermal expansion coefficients, e.g., quartz for the substrate of one element and fluorite for the substrate of the other element.

Assume that the focal position of a projection optical system other than a diffraction optical member tends to separate from the main body of the optical system with a rise in temperature. Especially in this case, when the focal position is to be corrected without adjusting the temperature, a glass material (e.g., quartz) having a low thermal expansion coefficient may be used for the substrate of a diffraction optical element having a positive power; and a glass material (e.g., fluorite) having a high thermal expansion coefficient, for the substrate of a diffraction optical element having a negative power.

In contrast to this, if the focal position tends to approach the main body of the optical system with a rise in temperature, a glass material having a high thermal expansion coefficient may be used for the substrate of a diffraction optical element having a positive power; and a glass material having a low thermal expansion coefficient, for the substrate of a diffraction optical element having a negative power.

The focal position moving effect obtained by such diffraction optical elements will be described in detail below. Consider a correction optical member constituted by a combination of a diffraction optical element having a positive power (focal length $f_1$) and a diffraction optical element having a negative power (focal length $-f_2$; $0 < f_1 \leq f_2$). As shown in FIG. 1, the space between the two diffraction optical elements is d. In an optical system constituted by this correction optical member, if the distance to a focusing position of a parallel beam incident on a diffraction optical element having a positive power is a synthetic focal length F, and the distance from this focusing position to a diffraction optical element having a negative power is D, the synthetic focal length F and the distance D are respectively given by equations (1) and (2):

$$D = (f_1 - d) \cdot f_2 / (f_2 - f_1 + d) \qquad (1)$$

$$F = f_1 \cdot f_2 / (f_2 - f_1 + d) \qquad (2)$$

Letting $\alpha_1$ be the thermal expansion coefficient of the substrate of the diffraction optical element having the focal length $f_1$, and $t_1$ be a temperature rise, the diffraction optical element is proportionally expanded (each diffraction pattern is expanded) on the entire surface by $(1+\alpha_1 \cdot t_1)$ times. Similarly, letting $\alpha_1$ be the thermal expansion coefficient of the substrate of the diffraction optical element having the focal length $-f_2$, and $t_2$ be a temperature rise, the diffraction optical element is proportionally expanded on the entire surface by $(1+\alpha_2 \cdot t_2)$ times.

In this case, the focal lengths of the respective diffraction optical elements are $f_1 \cdot (1+\alpha_1 \cdot t_1)$ and $-f_2 \cdot (1+\alpha_2 \cdot t_2)$, respectively. However, since the two diffraction optical elements are proportionally expanded, the focal positions are set at one point even after the temperature rises by $t_1$ and $t_2$. Therefore, any new aberration such as a spherical aberration is not caused unlike the case wherein the space between some lenses in a projection optical system is changed or pressure is controlled.

The distance D and the synthetic focal length F after temperature rises ($t_1$ and $t_2$) can be obtained by respectively substituting $f_1 \cdot (1+\alpha_1 \cdot t_1)$ and $f_2 \cdot (1+\alpha_2 \cdot t_2)$ into $f_1$ and $f_2$ in equations (1) and (2).

If the focal position is to be corrected without using any temperature adjustment mechanism for each diffraction optical element, i.e., the overall temperature of the optical system rises by a temperature t, then $t_1=t_2=t$. In addition, the focal lengths of the positive and negative diffraction optical elements are respectively $f_1 \cdot (1+\alpha_1 t)$ and $-f_2 \cdot (1+\alpha_2 t)$. If the distance D obtained after the temperature rises by t is represented by D', a variation $\Delta D$ in the focal position based on the two diffraction optical elements is given by equation (3):

$$\Delta D = D' - D \qquad (3)$$

When the thermal expansion coefficient $\alpha_1$ of the substrate of the diffraction optical element having the positive power is much smaller than the thermal expansion coefficient $\alpha_2$ of the diffraction optical element having the negative power, that is to say $\alpha_1 << \alpha_2$ is satisfied, then $\Delta D<0$ is satisfied as shown in the numerical calculation mentioned later.

If the focal point of a projection lens system which does not incorporate two diffraction optical elements moves in a direction to separate from the lens by $-\Delta D>0$ as the temperature rises by t, focal point movement can be perfectly corrected by using these diffraction optical elements having the positive power and the negative power. In addition, any new aberration such as a spherical aberration is not caused when the focal point is corrected.

As described above, if the focal point movement is $-\Delta D$ when the temperature of the projection lens rises by t, the values of $f_1$ and $f_2$ which completely cancel out the focus movement can be obtained as follows. The synthetic focal length F is set to a specific value, and a proper combination of $f_1$ and $f_2$ is obtained according to equation (2), and the distance D with no temperature rise and the distance D' with the temperature rise t, which are obtained according to equation (1), are substituted into equation (3). With this operation, the moving amount based on a temperature change can be obtained as a function of $f_1$. The value of $f_1$ obtained when this moving amount coincides with $\Delta D$ is the focal length to be obtained.

Assume that the synthetic focal length of the two diffraction optical elements is F=500 mm, and quartz and fluorite are respectively used for the substrates of diffraction optical elements having the positive power and the negative power. In this case, the respective thermal expansion coefficients are given as $\alpha_1=0.55\times10^{-6}/°$ C. and $\alpha_2=0.24\times10^{-4}/°$ C., and $\alpha_1<<\alpha_2$. As described above, with this combination, when the focal position (imaging position) of the projection optical system tends to separate from the optical system with a rise in temperature, the focal position movement can be corrected.

Assume that the value of $f_1$ of the positive diffraction optical element is set. In this case, if F=500 mm, the value of $f_2$ can be easily obtained from equation (2). Table 1 shows the values of $\Delta D$ with respect to various diffraction optical elements (having different values of $f_1$) with d (the space between the diffraction optical elements)=10 mm and F=500 mm.

TABLE 1

| $f_1$ (mm) | $f_2$ (mm) | $\Delta D$ (µm) |
|---|---|---|
| 300 | 725 | −7.275 |
| 200 | 316.667 | −16.412 |
| 150 | 200 | −25.215 |
| 100 | 112.5 | −41.820 |

As is apparent from Table 1, even if the synthetic focal length F remains the same, the value of $\Delta D$ increases as the values of the positive power and the negative power of the respective elements increase.

If, therefore, proper diffraction optical elements are selected for a correction optical member in accordance with, e.g., the focal position moving state of the projection optical system, the focal position can be corrected in accordance with an environmental change during an operation, such as a change in temperature.

In addition, since a focal position moving amount can be determined in the same manner with respect to an environmental change during an operation, such as a change in atmospheric pressure other than a change in temperature, diffraction optical elements may be designed in accordance with this moving amount to form a correction optical member. Note that since a change in refractive index occurs with a change in temperature or atmospheric pressure, variations in focal position with this change in refractive index must also be considered.

Such correction optical members may be formed respectively as a member for a change in temperature, a member for a change in atmospheric pressure, and a member for a change in refractive index which accompanies the above changes. The change states may be considered qualitatively to form such correction optical members by using the same material. In any case, each change state may be calculated or experimentally detected in the structure of a projection optical system which is designed separately.

If a temperature adjustment mechanism is specially arranged for a correction optical member, the focal position correction amount can be separately adjusted. Therefore, the focal position (imaging position) can be properly corrected by adjusting the correction amount (the moving amount in an opposite direction) of the correction optical member at a proper temperature independently of focal position variations due to a change in temperature of the overall optical system or a change in atmospheric pressure.

First Embodiment

Figure 2:
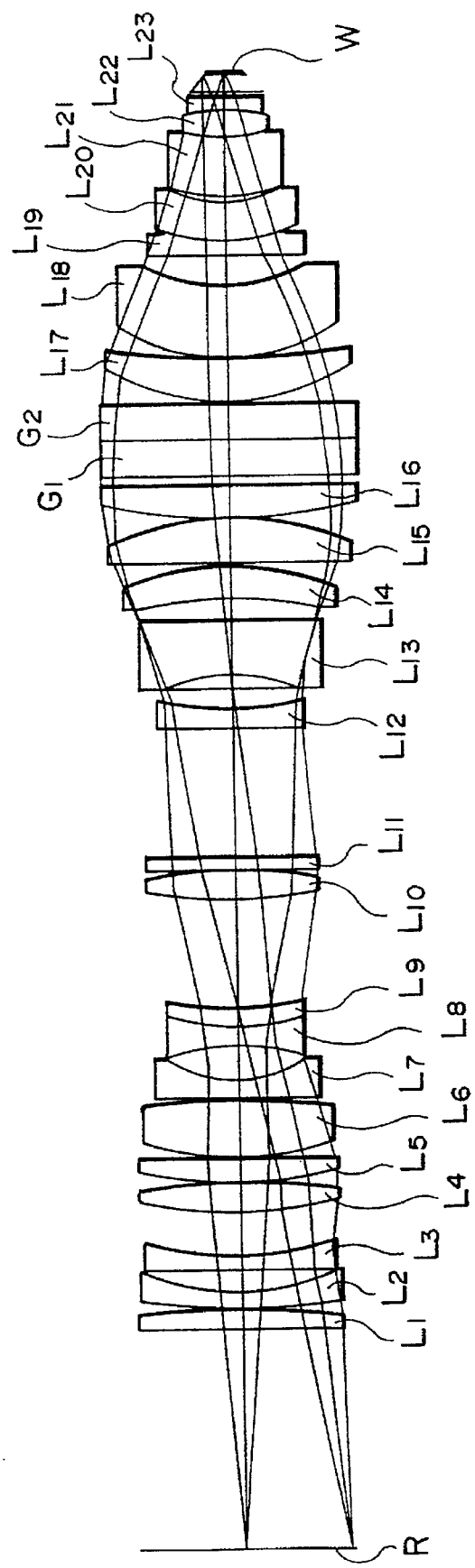
FIG. 2 is a view showing the schematic arrangement of a projection optical system according to the first embodiment of the present invention.

FIG. 2 shows the schematic arrangement of the projection lens system of a projection exposure apparatus according to the first embodiment of the present invention. In this embodiment, a projection optical system comprises refracting lens $L_1$ to $L_{23}$, diffraction optical elements (gratings) $G_1$ and $G_2$ constituting a correction optical member, and the like. An image of a pattern formed on a reticle R is formed and exposed on a wafer W. Table 2 shows the lens design data of the embodiment.

TABLE 2

| Interface of Element | | Radius of Curvature (mm) | Space (mm) | Material | Refractive Index |
|---|---|---|---|---|---|
| R - | (0) | ∞ | 119.99970 | | 1.00000 |
| L₁ | (1) | 702.71500 | 13.38843 | SIO2 | 1.50838 |
| | (2) | −452.72121 | .10000 | | 1.00000 |
| L₂ | (3) | 310.35737 | 10.00000 | SIO2 | 1.50838 |
| | (4) | 121.98580 | 9.17466 | | 1.00000 |
| L₃ | (5) | 466.83977 | 10.00000 | SIO2 | 1.50838 |
| | (6) | 153.83952 | 25.26970 | | 1.00000 |
| L₄ | (7) | 258.66475 | 16.32060 | SIO2 | 1.50838 |
| | (8) | −384.27349 | .10000 | | 1.00000 |
| L₅ | (9) | 210.77524 | 15.77922 | SIO2 | 1.50838 |
| | (10) | −788.26912 | .10000 | | 1.00000 |
| L₆ | (11) | 180.46155 | 31.67650 | SIO2 | 1.50838 |
| | (12) | −279.78713 | .10000 | | 1.00000 |
| L₇ | (13) | −5005.38620 | 10.00000 | SIO2 | 1.50838 |
| | (14) | 63.95957 | 20.43789 | | 1.00000 |
| L₈ | (15) | −142.60553 | 10.00000 | SIO2 | 1.50838 |
| | (16) | 92.11980 | .84532 | | 1.00000 |
| L₉ | (17) | 96.26337 | 10.00000 | SIO2 | 1.50838 |
| | (18) | 151.65899 | 61.24344 | | 1.00000 |
| L₁₀ | (19) | 236.10914 | 16.39902 | SIO2 | 1.50838 |
| | (20) | −292.56174 | .10000 | | 1.00000 |
| L₁₁ | (21) | 3429.89000 | 9.99619 | SIO2 | 1.50838 |
| | (22) | −471.14586 | 71.25896 | | 1.00000 |
| L₁₂ | (23) | −1250.73640 | 10.00000 | SIO2 | 1.50838 |
| | (24) | 137.89825 | 10.87506 | | 1.00000 |
| stop-surface | (25) | ∞ | 9.21311 | | 1.00000 |
| L₁₃ | (26) | −90.50355 | 32.80770 | SIO2 | 1.50838 |
| | (27) | −1167.39410 | 10.51470 | | 1.00000 |
| L₁₄ | (28) | −245.16351 | 17.56028 | SIO2 | 1.50838 |
| | (29) | −142.77992 | .10000 | | 1.00000 |
| L₁₅ | (30) | 1474.45560 | 27.23647 | SIO2 | 1.50838 |
| | (31) | −163.72378 | .10000 | | 1.00000 |
| L₁₆ | (32) | 337.67198 | 20.48181 | SIO2 | 1.50838 |
| | (33) | −890.73882 | 2.00000 | | 1.00000 |
| substrate | (34) | ∞ | 20.00000 | CAF2 | 1.46783 |
| G₁ FZP | (35) | ∞ | .00000 | (FZP) | 10001.0 |
| | (36) | −1350454.9 | .00000 | | 1.0 |
| G₂ FZP | (37) | −1774622.9 | .00000 | (FZP) | 10001.0 |
| substrate | (38) | ∞ | 20.00000 | SIO2 | 1.50838 |
| | (39) | ∞ | 1.10000 | | 1.00000 |
| L₁₇ | (40) | 133.83155 | 23.32030 | SIO2 | 1.50838 |
| | (41) | 494.30809 | .10000 | | 1.00000 |
| L₁₈ | (42) | 109.11314 | 42.00002 | SIO2 | 1.50838 |
| | (43) | 92.74443 | 15.03848 | | 1.00000 |
| L₁₉ | (44) | 622.54747 | 10.00000 | SIO2 | 1.50838 |
| | (45) | 176.36707 | .10000 | | 1.00000 |
| L₂₀ | (46) | 110.88121 | 21.87975 | SIO2 | 1.50838 |
| L₂₁ | (47) | 64.57716 | 3.95072 | | 1.00000 |
| | (48) | 101.01028 | 31.83777 | SIO2 | 1.50838 |
| | (49) | 67.54003 | .10000 | | 1.00000 |
| L₂₂ | (50) | 51.39628 | 14.31898 | SIO | 1.50838 |
| | (51) | −200.48137 | 1.30832 | | 1.00000 |
| L₂₃ | (52) | −132.18925 | 8.00000 | SIO2 | 1.50838 |
| | (53) | −312.63018 | 2.00000 | | 1.00000 |
| W - | (54) | ∞ | 9.99956 | | 1.00000 |

FZP: diffraction optical element
SIO2: quarts
CAF2: fluorite
(Note) Surfaces (35) and (38) are laminated surfaces, surface (35) is the exit surface of the substrate and the incident surface of FZP, and surface (38) is the exit surface of FZP and the incident surface of the substrate.

In Table 2, the respective numerical values sequentially indicate, from the left side, the interface (the number in the parenthesis), radius of curvature, space, material, and refractive index of each element such as a lens when viewed from the reticle side, and "FZP", "SIO2", and "CAF2" respectively indicate a diffraction optical element, quartz, and fluorite.

In this embodiment, the diffraction optical elements $G_1$ and $G_2$ are constituted by BOEs having diffraction patterns with stepped cross-sections on the substrate surfaces. These two elements are arranged such that their pattern surfaces oppose each other at a short distance. Of these diffraction patterns, the patterns of a diffraction optical element having a positive power are annular (concentric) Fresnel zone patterns, and the patterns of a diffraction optical element having a negative power are patterns which are arranged at the positions of the Fresnel zone patterns to cause diffraction outward.

Figure 3:
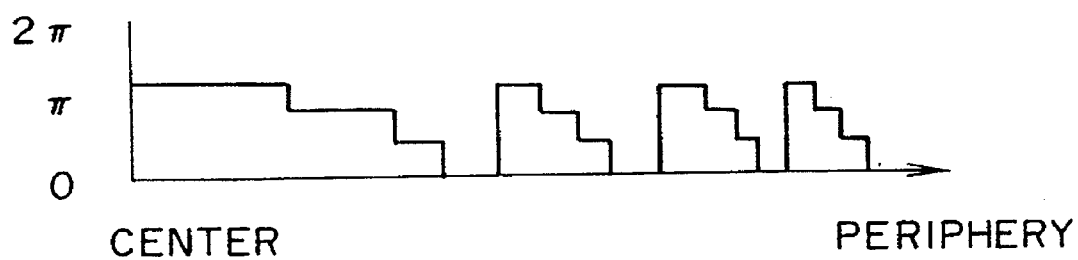
FIG. 3 is a graph showing the schematic arrangement of a diffraction optical element having a positive power in the first embodiment.
Figure 4:
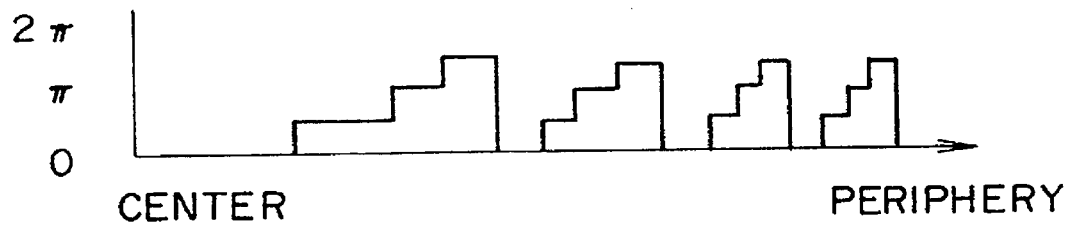
FIG. 4 is a graph showing the schematic arrangement of a diffraction optical element having a negative power in the first embodiment.

More specifically, as shown in FIG. 3, the diffraction patterns of the diffraction optical element having the positive power are arranged such that a phase change increases toward the central portion. With this arrangement, a light beam which is transmitted through the diffraction patterns is focused. As shown in FIG. 4, the stepped patterns of the diffraction optical element having the negative power are arranged such that a phase change increases toward the periphery. With this arrangement, a light beam which is transmitted through the patterns is diverged.

These diffraction optical elements are arranged at or near a position, in the projection optical system according to the embodiment, where the diameter of a light beam is maximized. With the arrangement of the diffraction optical elements at this position, the refracting power of each diffraction optical element can be reduced (or the focal length thereof can be lengthened or optical path deflection ratio thereof can be reduced). For this reason, a focusing error or the like caused by an increase in temperature or the like can be properly corrected without degrading an aberration in the projection optical system. In addition, a diffraction optical element having a weak refracting power can be easily manufactured.

Figure 5:
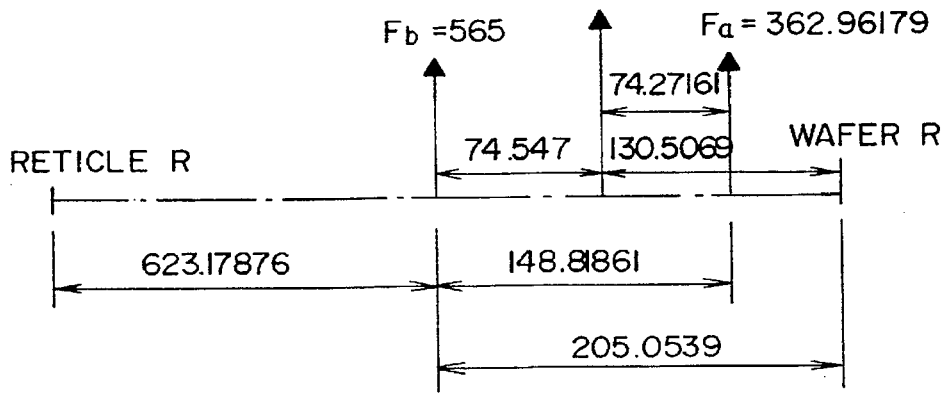
FIG. 5 is a view for explaining a method of calculating focal lengths in the present invention.

The focal length of the projection optical system in this embodiment will be described next. As shown in FIG. 5, let $F_a$ be the synthetic focal length of lenses (front-stage optical system) ranging from the reticle R to the position immediately before the diffraction optical elements, assuming that the projection optical system according to this embodiment is divided into two portions at the diffraction optical elements, $F_b$ be the synthetic focal length of the diffraction optical elements, and $F_c$ be the synthetic focal length of lenses (rear-stage optical system) ranging from the position immediately after the diffraction optical elements. FIG. 5 shows the respective numerical values of these synthetic focal lengths in mm. Providing that the overall projection optical system is considered as a synthetic lens system constituted by three optical systems, the respective focal lengths are given by $$1/a_0+1/b_1=1/F_a \quad (4)$$

$$-1/(b_1-d_1)+1/b_2=1/F_b \quad (5)$$

$$-1/(b_2-d_2)+1/b_3=1/F_c \quad (6)$$

Let $a_0$ be the distance from an object point (reticle R) to the principal position of the front-stage optical system, $b_1$ be the distance from the principal position of the front-stage optical system to an image point thereof, $d_1$ be the distance from the principal position of the front-stage optical system to the diffraction optical elements, $d_2$ be the distance from the diffraction optical elements to the principal position of the rear-stage optical system, and $b_3$ be the distance from the principal position of the rear-stage optical system to an image point thereof.

In these equations (4) to (6), the focal lengths $F_a$, $F_b$, and $F_c$ of the respective optical systems and the principal positions of the front- and rear-stage optical systems are obtained by paraxial ray tracing. The distances $d_1$ and $d_2$ are determined on the basis of the obtained values.

For example, the principal position of the rear-stage optical system is obtained as follows. First of all, a parallel light beam is caused to be incident on the rear-stage lens system immediately after the diffraction optical element, and paraxial ray tracing to the wafer W is performed. With this operation, an imaging position is set (89.15853 mm) after the wafer W. Since the focal length $F_c$ is 219.66543 mm, the principal position of the rear-side lens system is at 130.5069 mm before the wafer W. In addition, from the sum of the spaces between the lenses and the like, the distance between the diffraction optical elements and the wafer W is given as 205.0539 mm. Therefore, the distance $d_2$ is 205.0539−130.5069=74.5470 (mm).

Substitutions of the respective values of $F_a$, $F_b$, $F_c$, $a_0$, $d_1$, and $d_2$ obtained by the above method into equations (1) to (6) yield the values of $b_1$ to $b_3$. The value of $b_3$ (119.53807 mm) obtained finally almost coincides with 130.5069 mm corresponding to the principal position of the rear-side optical system before the wafer W, as described above.

The reason why the two values do not perfectly coincide with each other is that an error occurs owing to variations in principal position depending on the direction in which a parallel beam is incident. As will be described later, since variations (change ratio) in $b_3$ due to a change in temperature or the like is a matter of concern rather than the value of $b_3$ itself, no significant problem is posed even if the above values do not perfectly coincide with each other.

Letting $f_{11}$ and $f_{21}$ be the focal lengths of the first and second diffraction optical elements, with which the synthetic focal length of the two diffraction optical elements becomes $F_b$, then their relationship is expressed by equation (7). Note that the space between the two diffraction optical elements is $d_3$.

$$1/F_b=1/f_{11}+1/f_{21}-d_3/f_{11}f_{21} \quad (7)$$

When the synthetic focal length $F_b$ is determined, the focal lengths $f_{11}$ and $f_{12}$ of the first and second diffraction optical elements are determined. As the focal length $f_{11}$ changes, the focal length $f_{21}$ uniquely changes.

Letting $\alpha_{11}$ and $\alpha_{21}$ be the thermal expansion coefficients of the substrate materials of the first and second diffraction optical elements, focal lengths $f_{11}$ and $f_{21}$ of the respective diffraction optical elements in a case wherein the temperature rises by t° C. are given by $$f_{1t}=f_{11}(1+\alpha_{11}t) \quad (8)$$

$$f_{2t}=f_{21}(1+\alpha_{21}t) \quad (9)$$

When these values are substituted into equation (7) in place of $f_{11}$ and $f_{21}$, a synthetic focal length $F_{bt}$ of the two diffraction optical elements in the case wherein the temperature rises by t° C. can be obtained. Substitutions of values based on this numerical value into equations (1) to (3) yield a focal position $b_{3t}$ in the case wherein the temperature rises by t° C. Therefore, a focal point moving amount based on thermal expansion of each diffraction optical element can be obtained by $\Delta b_3=b_{3t}-b_3$.

Figure 6:
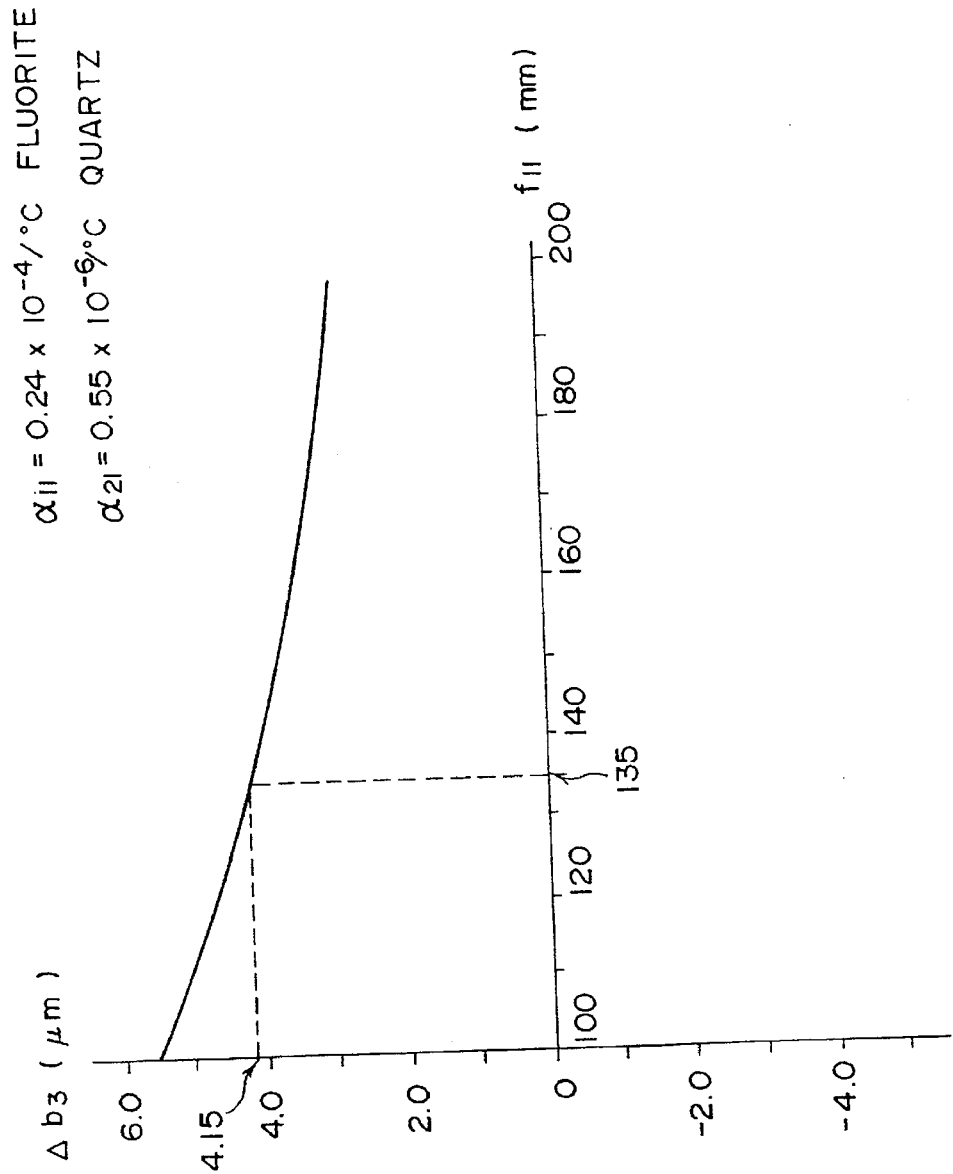
FIG. 6 is a graph showing changes in focal position when the focal length of a diffraction optical element $G_1$ is changed from 100 mm to 200 mm.
Figure 7:
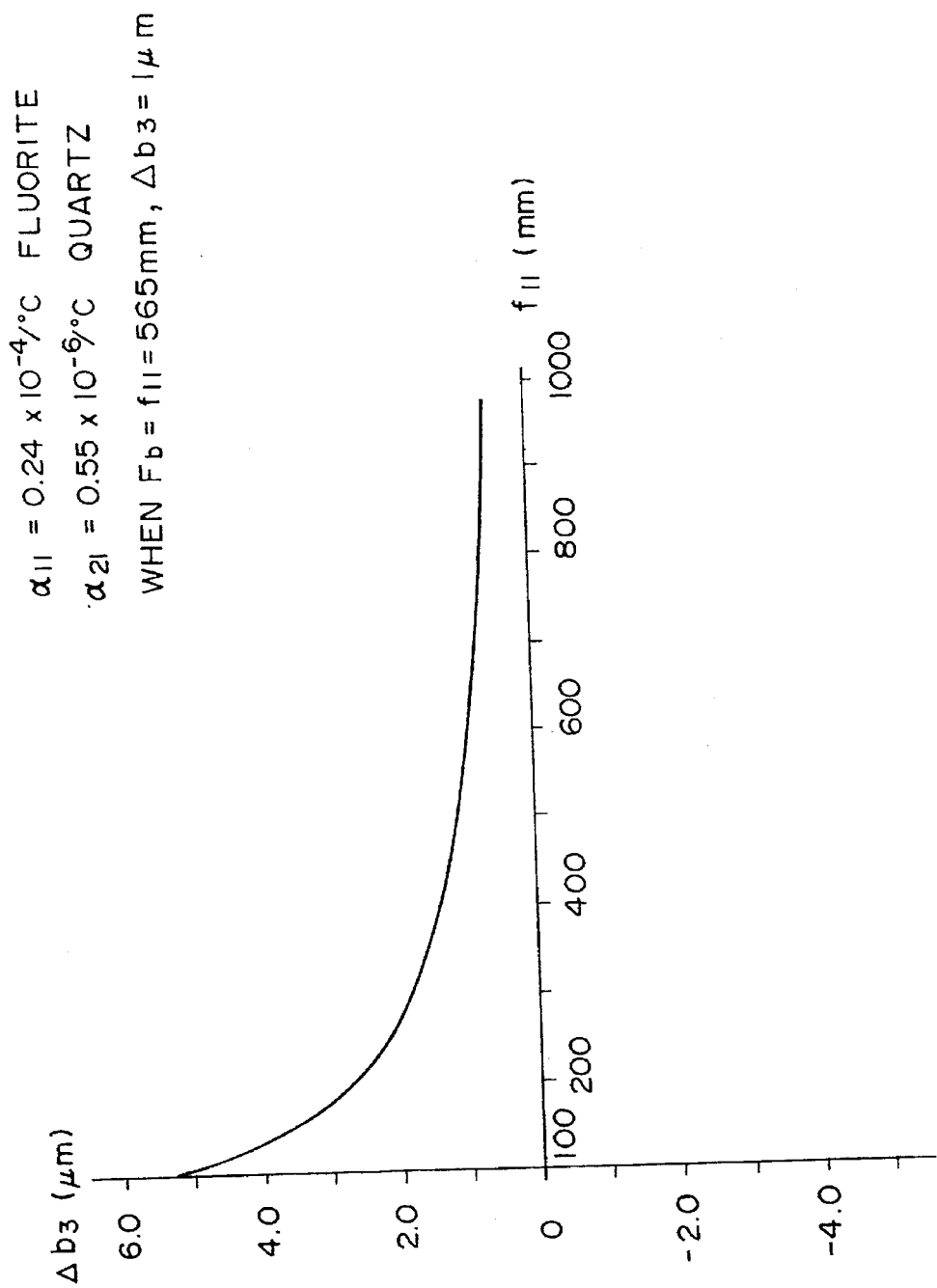
FIG. 7 is a graph showing changes in focal position when the focal length of the diffraction optical element $G_1$ is changed from 100 mm to 200 mm in a case wherein the substrates of the diffraction optical element $G_1$ and a diffraction optical element $G_2$ respectively consist of fluorite and quartz.
Figure 8:
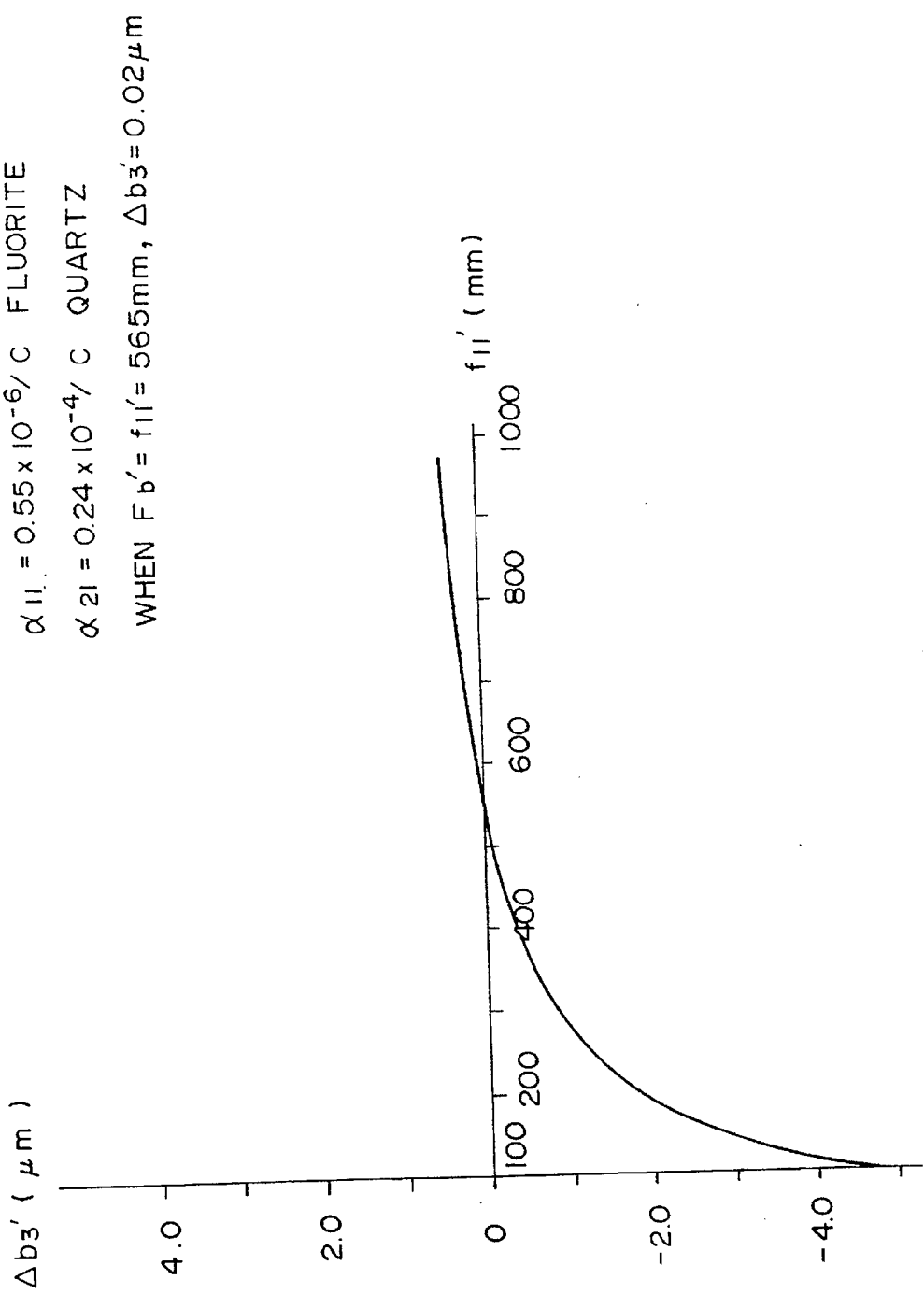
FIG. 8 is a graph showing changes in focal position when the focal length of the diffraction optical element $G_1$ is changed from 100 mm to 200 mm in a case wherein the substrates of the diffraction optical elements $G_1$ and $G_2$ respectively consist of quartz and fluorite.

FIGS. 6 to 8 show the states of focal position changes ($\Delta b_3$) of the two diffraction optical elements in this embodiment. FIGS. 6 to 8 are graphs each showing the relationship between the focal length $f_{11}$ (abscissa; mm) and the focal position change amount $\Delta b_3$ (ordinate; μm) while the synthetic focal length ($F_b$, =565 mm) of the two diffraction optical elements is kept constant.

FIG. 6 shows the state wherein the focal length $f_{11}$ of the diffraction optical element $G_1$ is changed from 100 mm to 200 mm. Similarly, in order to clarify the variation state of the rough focal position change amount $\Delta b_3$, FIGS. 7 and 8 show the states wherein the focal length $f_{11}$ is changed from 100 mm to 1,000 mm. FIG. 7 shows the case wherein the diffraction optical elements $G_1$ and $G_2$ in this embodiment are respectively constituted by fluorite and quartz substrates. FIG. 8 shows another embodiment in which diffraction optical elements $G_1$ and $G_2$ are respectively constituted by quartz and fluorite substrates.

The projection optical system in this embodiment is almost the same in basic design as the apparatus disclosed in Japanese Patent Laid-Open No- 4-214516 described above, but is different in the arrangement and the like of the diffraction optical elements. For reference, Table 3 shows the overall focal position change state with respect to a change in temperature in the apparatus disclosed in Japanese Patent Laid-Open No. 4-214516.

TABLE 3

| Materials for Lenses | Influences of Thermal Expansion | Influences of Refractive Index Change | Total Moving Amount |
|---|---|---|---|
| quarts for all lenses as in Japanese Patent Laid-Open No. 4-214516 | (1) 0.08 μm (2) 0.11 μm | −4.21 μm −4.21 μm | −4.13 μm −4.10 μm |
| replaced with fluorite in Japanese Patent Laid-open No. 4-214516 | (3) 3.67 μm (4) 4.60 μm | 2.05 μm 2.05 μm | 5.72 μm 6.65 μm |

Table 3 shows the focal point moving amounts of projection optical systems in a case wherein the temperature rises by 1° C. When the focal length increases (the focal position moves far), the corresponding moving amount is indicated by a positive numerical value. In Table 3, influences (1) and (2) of thermal expansion are obtained without considering the thermal expansion of the substrate of a Fresnel lens, whereas influences (2) and (4) are obtained when the thermal expansion of the substrate of each diffraction optical element is considered as a change with a change in temperature as in the case of a lens.

In the case of Japanese Patent Laid-Open No. 4-214516, quartz is used for all lenses. For reference, however, moving amounts are calculated in a case wherein fluorite is used for all the lenses, and are shown in Table 3 as in the case of quartz. As is apparent from Table 3, the focal points of the lenses change in different direction with a change in temperature depending on materials (glass materials) for the lenses.

As is apparent from Table 3, the focal position variation amount of the projection optical system itself is the same as that in the case wherein the thermal expansion of each diffraction optical element is not considered. That is, as indicated by "(1)" in Table 3, the moving amount is −4.13 µm. If, therefore, the focal length $f_{11}$ of the first diffraction optical element $G_1$ is selected near the value with which the focus variation amount based on the two diffraction optical elements is about 4.13 µm, $f_{11}$=135 mm is proper. With this value, the focal length $f_{11}$ of the second diffraction optical element $G_2$ is determined as $f_{21}$=−177.38 mm. In this case, the total synthetic focus moving amount based on focus movement of each sequential is $\Delta b_3$=4.15 µm.

Assume that the focal lengths of the two diffraction optical elements $G_1$ and $G_2$ are determined on the basis of these numerical values, and the focal length of the overall projection optical system and the moving amounts of the focal point due to a change in temperature are calculated again. Table 4 shows the total moving amount in a case wherein the temperature rises by 1° C., and the influence of thermal expansion of each diffraction optical element.

TABLE 4

| Materials for Lenses | Influences of Thermal Expansion | Influences of Refractive Index Change | Total Moving Amount |
| --- | --- | --- | --- |
| quartz except for substrate of $G_1$ for which fluorite is used as in Japanese Patent Laid-Open No. 4-214516 | (5) 3.81 µm | −4.14 µm | −0.33 µm |

As is apparent from Table 4 as well, the moving amount of the focal position of the overall projection optical system of this embodiment decreases to 1/10 or less (about 1/12) of that in the case of Japanese Patent Laid-Open No. 4-214516. Note that the design data of this embodiment, which are shown in Table 2, are obtained by finely adjusting the finally determined positions, focal lengths, and the like of the respective diffraction optical elements.

As described above, in this embodiment, in calculating a focal position moving amount based on thermal expansion and refractive index changes, the projection optical system is divided into front and rear blocks at the position of the diffraction optical member, and calculations are independently performed in the respective blocks. Thereafter, the resultant values are substituted into the corresponding equations to check the overall focal length again. With this operation, a good corrected state can be obtained.

The present invention is not limited to the calculation method in the above embodiment. Any calculation means can be used as long as it can detect a state wherein the focal position moving amount of the overall projection optical system is canceled out by the moving amounts of the correction optical member and the optical system other than the correction optical member.

In this embodiment, since the projection lens system having the same arrangement as that in Japanese Patent Laid-Open No. 4-214516 is used, the focal point moving amount of the optical system, excluding the diffraction optical elements, with respect to a change in temperature is displaced to the negative side (toward the projection lens system). In order to correct this displacement, the embodiment uses the correction optical member having the above arrangement. As indicated by the above modification, the moving amount and direction of this member vary in projection optical systems.

If, for example, a correction optical member having an arrangement like the one shown in FIG. 8 is used for correction movement with respect to a reverse displacement to the projection optical system of this embodiment, the focal position can be corrected. For this reason, in forming each projection optical system, a focal position moving amount and the like must be calculated in advance, and a corresponding proper correction optical member must be determined.

As is apparent from FIG. 7, when the focal length of the diffraction optical element $G_1$ is 565 mm, the moving amount $\Delta b_3$ of the synthetic focal position is 1 µm. Referring to FIG. 8, when a focal length $f_{11}'$ is 552 mm or less, a moving amount $\Delta b_3'$ of the synthetic focal position exhibits reverse variation characteristics to those shown in FIG. 7. When the focal length $f_{11}'$ of a diffraction optical element $G_1'$ is 565 mm, the moving amount $\Delta b_3'$ of the synthetic focal position is 0.02 µm.

Each of the embodiments shown in FIGS. 7 and 8 uses a combination of diffraction optical elements respectively having positive and negative powers. However, when the correction amount for the focal length of the projection optical system is 0.02 µm to 1 µm, correction cannot be performed with this combination. In such a case, a combination of diffraction optical elements, both having a positive or negative power, or a combination of three or more diffraction optical elements is preferably used.

In the above embodiments, the projection optical system is designed to be adaptable to thermal expansion and refractive index changes with respect to a change in temperature. However, since focal position movement with respect to a change in atmospheric pressure can be detected in the same manner as described above, a corresponding correction moving amount can also be corrected properly by applying the present invention.

In the above description, the overall projection optical system undergoes the same temperature change. This is because the system is designed to automatically correct the focal position in accordance with a change in temperature without using any special mechanism.

No problem is posed when a system capable of almost accurately correct the focal position in accordance with an environmental change in the apparatus can be selected, as in the above embodiments. Assume that automatic correction is difficult to perform (a moving amount with respect to an environmental change does not have the same magnitude in an opposite direction). In this case, for example, a temperature adjustment mechanism may be arranged for the correction optical member to forcibly change the focal position of each diffraction optical element. With such a means, focal position movement with respect to an environmental change can be corrected.

Second Embodiment

Figure 9:
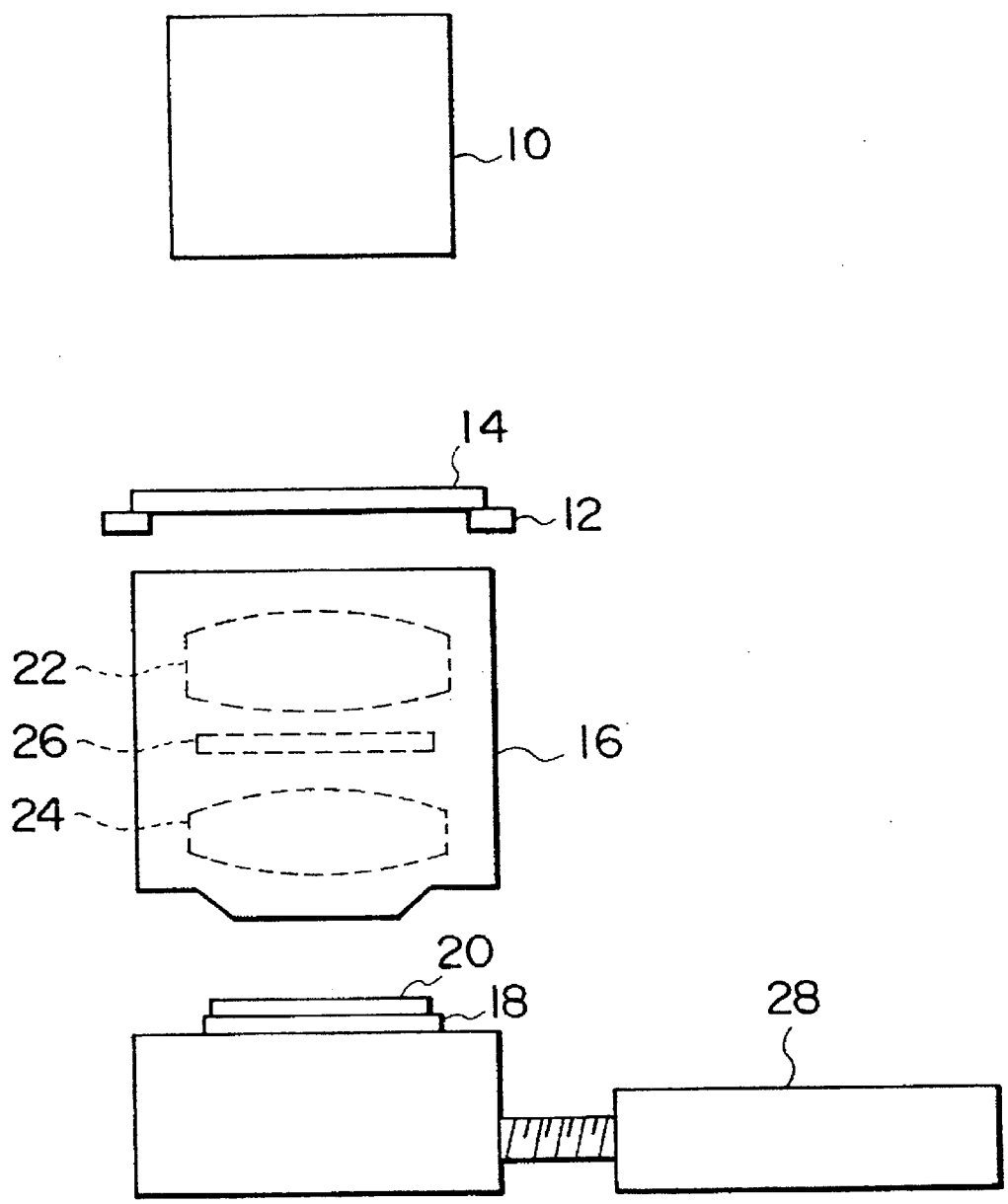
FIG. 9 is a view showing the schematic arrangement of a projection exposure apparatus including a projection optical system having diffraction optical elements, quartz lenses, and fluorite lenses.

A projection exposure apparatus using the above projection optical system will be described next. FIG. 9 shows the schematic arrangement of this projection exposure apparatus.

First of all, an illumination optical system 10 emits an illumination light beam. This light beam is irradiated on a photomask 14 supported by a mask stage 12. A light beam from the photomask 14 passes through a projection optical system 16 and reaches a photosensitive substrate 20 supported on a substrate stage 18. Patterns such as semiconductor element patterns formed on the photomask 14 are projected on the photosensitive substrate 20 by the projection optical system 16.

In this case, the projection optical system 16 is constituted by a plurality of optical members, and incorporates a diffraction optical element 26 as a correction optical member for correcting focal position variations caused by a temperature change, in addition to general lens systems 22 and 24. As described above, therefore, variations in focal position in the presence of only the lens systems 22 and 24 are suppressed by the diffraction optical element 26, so that the patterns formed on the photomask 14 can be transferred onto the photosensitive substrate 20 with a high resolution.

The substrate stage 18, which supports the photosensitive substrate 20, is driven by a driving mechanism 28 in a direction perpendicular to the optical axis of the projection optical system 16 to sequentially transfer the patterns formed on the photomask 14 onto a plurality of areas on the substrate 20.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.170377/1994 filed on Jun. 30, 1994 is hereby incorporated by reference.

What is claimed:

1. A projection optical system for projecting a light beam from a first object onto a second object, comprising:
   a correction target optical system including at least one of an optical member for refracting a light beam and an optical member for reflecting a light beam; and
   a correction optical member having a diffraction optical element, said correction optical member being arranged such that a direction of focal position movement caused by an environmental change during an operation along an optical axis direction of said correction target optical system is opposite to that of focal position movement of said correction target optical system, which is caused along the optical axis direction by the same environmental change.

2. A system according to claim 1, wherein when an environmental change occurs during an operation, a synthetic value of focal position movement of said correction target optical system along the optical axis direction and focal position movement of said correction optical member along the optical axis direction of said correction target optical system becomes substantially zero.

3. A system according to claim 1, wherein said correction optical member comprises a plurality of diffraction optical elements identical to said diffraction optical element, and values of focal position movement of said diffraction optical elements along the optical axis direction of said correction target optical system are synthesized.

4. A system according to claim 1, wherein said correction optical member comprises at least one diffraction optical element having a function of converging an incident parallel light beam, and at least one diffraction optical element having a function of diverging an incident parallel light beam.

5. A system according to claim 1, wherein the environmental change during an operation of said projection optical system is a temperature change.

6. A system according to claim 1, wherein said correction optical member comprises first and second diffraction optical elements having different thermal expansion coefficients.

7. A system according to claim 6, wherein said first diffraction optical element has a positive power, a thermal expansion coefficient of a material for a substrate on which said first diffraction optical element is formed is lower than that of said correction target optical system, said second diffraction optical element has a negative power, and a thermal expansion coefficient of a material for a substrate on which said second diffraction optical element is formed is higher than that of said correction target optical system.

8. A system according to claim 7, wherein the material for the substrate on which said first diffraction optical element is formed is quartz, and the material for the substrate on which said second diffraction optical element is formed is fluorite.

9. A system according to claim 6, wherein said first diffraction optical element has a positive power, a thermal expansion coefficient of a material for a substrate on which said first diffraction optical element is formed is higher than that of said correction target optical system, said second diffraction optical element has a negative power, and a thermal expansion coefficient of a material for a substrate on which said second diffraction optical element is formed is lower than that of said correction target optical system.

10. A system according to claim 9, wherein the material for the substrate on which said first diffraction optical element is formed is fluorite, and the material for the substrate on which said second diffraction optical element is formed is quartz.

11. A projection exposure apparatus for transferring a pattern formed on a mask onto a photosensitive substrate, comprising:
   an illumination optical system for emitting an illumination light beam;
   a mask stage for supporting the mask illuminated with the illumination light beam from said illumination optical system;
   a substrate state for supporting the photosensitive substrate,; and
   a projection optical system for making a position on the mask placed on said mask stage conjugate to a position on the photosensitive substrate placed on said substrate stage, said substrate stage positioning the substrate in a direction perpendicular to an optical axis of said projection optical system, wherein said projection optical system comprises a correction target optical system having a lease one of an optical member for refracting a light beam, and a correction optical member having a diffraction optical element, said correction optical member being arranged such that a direction of focal position movement caused by an environmental change during an operation along an optical axis direction of said correction target optical system is opposite to that of focal position movement of said correction target optical system, which is caused along the optical axis direction by the same environmental change.

12. An apparatus according to claim 11, wherein when an environmental change occurs during an operation, a synthetic value of focal position movement of said correction target optical system along the optical axis direction and focal position movement of said correction optical member along the optical axis direction of said correction target optical system becomes substantially zero.

* * * * *